(12) United States Patent
Lee et al.

(10) Patent No.: US 8,137,472 B2
(45) Date of Patent: Mar. 20, 2012

(54) SEMICONDUCTOR PROCESS

(75) Inventors: Chang-Hsiao Lee, Shanhua Township, Tainan County (TW); Shih-Fang Tzou, Jhudong Township, Hsinchu County (TW); Ming-Da Hsieh, Kaohsiung (TW); Yu-Tsung Lai, Fongyuan (TW); Jyh-Cherng Yau, Tainan (TW); Jiunn-Hsiung Liao, Shanhua Township, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/161,659

(22) Filed: Jun. 16, 2011

(65) Prior Publication Data

US 2011/0244678 A1    Oct. 6, 2011

Related U.S. Application Data

(62) Division of application No. 12/259,033, filed on Oct. 27, 2008, now abandoned.

(51) Int. Cl.
*H01L 21/302* (2006.01)

(52) U.S. Cl. .......................... 134/1.3; 510/175; 510/176

(58) Field of Classification Search .................. 510/175, 510/176; 134/1.3
See application file for complete search history.

(56) References Cited

U.S. PATENT DOCUMENTS

| | | | |
|---|---|---|---|
| 5,861,076 A * | 1/1999 | Adlam et al. | 156/281 |
| 2005/0261151 A1* | 11/2005 | Lee et al. | 510/175 |
| 2006/0014391 A1 | 1/2006 | Lee et al. | |
| 2006/0024951 A1 | 2/2006 | Schuehrer et al. | |
| 2006/0042651 A1 | 3/2006 | Verhaverbeke et al. | |
| 2006/0234516 A1 | 10/2006 | Hong et al. | |
| 2006/0252252 A1* | 11/2006 | Zhu et al. | 438/618 |
| 2006/0287208 A1* | 12/2006 | Lee et al. | 510/175 |
| 2007/0006894 A1 | 1/2007 | Zhang et al. | |
| 2010/0105205 A1* | 4/2010 | Lee et al. | 438/656 |

* cited by examiner

*Primary Examiner* — Gregory Webb
(74) *Attorney, Agent, or Firm* — WPAT, PC; Justin King

(57) ABSTRACT

A semiconductor process is provided. First, a metal layer, a dielectric layer and a patterned hard mask layer are sequentially formed on a substrate. Thereafter, a portion of the dielectric layer is removed to form an opening exposing the metal layer. Afterwards, a cleaning solution is used to clean the opening. The cleaning solution includes a triazole compound with a content of 0.00275 to 3 wt %, sulfuric acid with a content of 1 to 10 wt %, hydrofluoric acid with a content of 1 to 200 ppm and water. The semiconductor process can reduce the possibility of having an incomplete turning on, a leakage or a short, so that the yield of the product is increased.

15 Claims, 3 Drawing Sheets

SEMICONDUCTOR PROCESS

CROSS-REFERENCE TO RELATED APPLICATION

This is a divisional application of an application Ser. No. 12/259,033, filed Oct. 27, 2008. The entirety of the above-mentioned patent are hereby incorporated by reference herein and made a part of this specification.

FIELD OF THE INVENTION

The present invention relates to a semiconductor process, and more particularly to a cleaning solution and a semiconductor process using the same.

BACKGROUND OF THE INVENTION

The dimension of a device is getting smaller as the semiconductor technology is getting developed. When the level of integration of ICs is increased, the surface area of the chip is not sufficient to fabricate the required interconnections in a single layer, so that a design including more than two layers of metal interconnections is adopted in the VLSI technology. The dual damascene process is a widely used metal interconnection technology due to the advantages of improving the device reliability and increasing the production.

The dual damascene process includes forming a dual damascene opening and filling a metal in the dual damascene opening. Generally speaking, a lot of resides form during the process of etching the dual damascene opening. Thus, a cleaning process is performed before the step of filling the metal in the dual damascene opening. Hydrofluoric acid (HF) is usually used as a cleaning solution in the cleaning process. However, when the titanium nitride (TiN) hard mask layer is applied in the dual damascene process, the HF cleaning solution cannot remove the residues effectively and is easy to cause the copper loss in the copper layer exposed by the dual damascene opening; thus, the device feature of the copper layer is affected and the yield of the product is reduced.

SUMMARY OF THE INVENTION

The present invention provides a semiconductor process to prevent the surface of the metal layer exposed by the opening from being corroded by the cleaning solution.

The present invention provides a semiconductor process. First, a metal layer, a dielectric layer and a patterned hard mask layer are sequentially formed on a substrate. Thereafter, a portion of the dielectric layer is removed to form an opening exposing the metal layer. Afterwards, a cleaning solution is used to clean the opening. The cleaning solution includes a triazole compound with a content of 0.00275 to 3 wt %, sulfuric acid with a content of 1 to 10 wt %, hydrofluoric acid with a content of 1 to 200 ppm and water.

According to an embodiment of the present invention, the triazole compound includes benzotriazole (BTA), for example.

According to an embodiment of the present invention, the metal layer includes a first metal.

According to an embodiment of the present invention, the first meal includes copper, for example.

According to an embodiment of the present invention, the metal layer includes copper or copper alloy, for example.

According to an embodiment of the present invention, the patterned hard mask layer includes a second metal, and the second metal is different from the first metal.

According to an embodiment of the present invention, the second metal includes titanium or tantalum, for example.

According to an embodiment of the present invention, the patterned hard mask layer includes titanium, titanium nitride, tantalum, tantalum nitride or combinations thereof, for example.

According to an embodiment of the present invention, the opening includes a dual damascene opening.

According to an embodiment of the present invention, the opening includes a via opening.

According to an embodiment of the present invention, the dielectric layer includes an inorganic material or an organic material, for example.

According to an embodiment of the present invention, after the step of using the cleaning solution to clean the opening, the process further includes performing another cleaning step by introducing de-ionized water with $CO_2$.

According to an embodiment of the present invention, the semiconductor process further includes forming a conductive layer on the substrate to fill the opening exposing the metal layer.

According to an embodiment of the present invention, the conductive layer includes a barrier layer and a metal layer on the barrier layer.

According to an embodiment of the present invention, the semiconductor process further includes removing the patterned hard mask layer and a portion of the conductive layer on the substrate to form a via plug and a conductive line.

In the present invention, using the cleaning solution including a triazole compound, sulfuric acid, hydrofluoric acid and water to clean the opening can effectively remove the residues generated during the step of forming the opening, especially the polymers formed from the metal-containing hard mask layer. Further, the triazole compound can prevent the metal layer exposed by the opening from being corroded. Thus, the semiconductor process and the cleaning solution of the present invention can reduce the possibility of having an incomplete turning on, a leakage or a short, so that the yield of the product is increased.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Currently, a metallic material such as titanium nitride (TiN) is used in a hard mask layer in a dual damascene process. However, after the dielectric layer is etched to form a dual damascene opening, the residues include polymers formed from the etching gases, organic polymers formed from the etching gases and the dielectric layer and metal-containing polymers formed from the etching gases and the TiN hard mask layer, so that the conventional HF cleaning solution cannot remove the formed residues effectively.

Further, the dual damascene opening exposes two kinds of the metals, one of which is titanium of the TiN hard mask layer on the sidewall of the dual damascene opening, and the other of which is copper of the copper layer exposed at the bottom of the dual damascene opening. During the cleaning process, the conventional HF cleaning solution has become a good electrolyte, so that the Galvanic effect is generated, the surface of the copper layer is corroded, and the copper loss is caused. On the contrary, the present invention provides a semiconductor process in which the cleaning solution can achieve the purpose of effective cleaning and copper loss is avoided.

In an embodiment of the present invention, the cleaning solution includes a triazole compound with a content of 0.00275 to 3 wt %, sulfuric acid with a content of 1 to 10 wt %, hydrofluoric acid with a content of 1 to 200 ppm and water.

The following dual damascene process is provided for illustration purposes and is not to be construed as limiting the present invention.

FIGS. 1A to 1F schematically illustrate cross-section views of a semiconductor process according to an embodiment of the present invention.

Figure 1A:
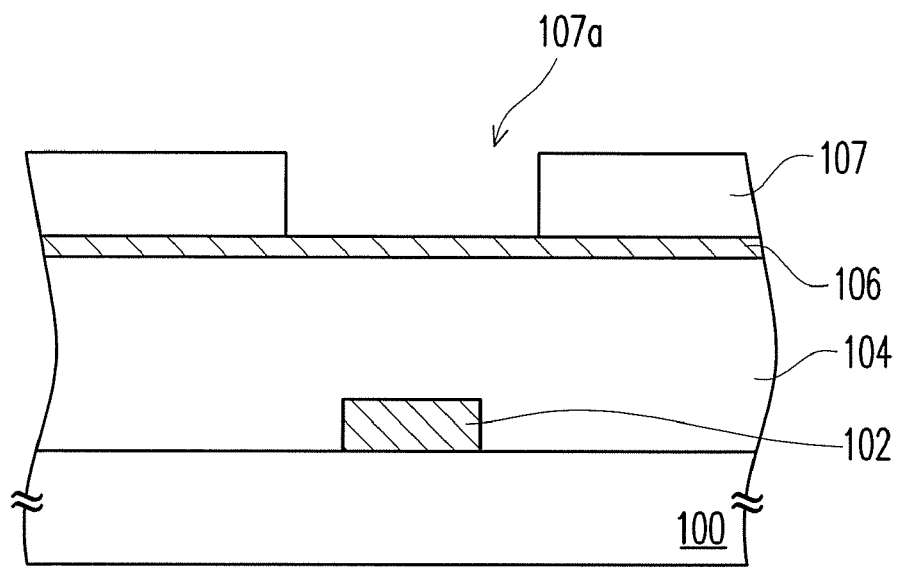
FIGS. 1A to 1F schematically illustrate cross-section views of a semiconductor process according to an embodiment of the present invention.

Referring to FIG. 1A, a substrate 100 having a metal layer 102 thereon is provided. The substrate 100 may be a P-type doped silicon substrate, a N-type doped silicon substrate, an epitaxial silicon substrate, a gallium arsenide (GaAs) substrate, an indium phosphide (InP) substrate or a silicon germanium (SiGe) substrate. The metal layer 102 may be a conductive line, such as a copper line, in the interconnection process. In this embodiment, the metal layer 102 includes a copper-containing material such as copper or copper alloy. In an embodiment, the copper alloy may be a copper silicon alloy.

Thereafter, a dielectric layer 104 is formed on the metal layer 102. The dielectric layer 104 may include a low dielectric constant material (dielectric constant k<4). The low k material may be an inorganic material such as hydrogen silsesquioxane (HSQ) or fluorinated silicate glass (FSG), or an organic material such as fluorinated poly-(arylene ether) (Flare), poly-(arylene either) (SILK) or parylene. The method of forming the dielectric layer 104 includes performing a chemical vapor deposition (CVD) process, for example.

Afterwards, a hard mask layer 106 and a photoreist layer 107 having a trench pattern 107a are sequentially formed on the dielectric layer 104. In an embodiment, the hard mask layer 106 includes a titanium-containing material such as titanium or TiN, a tantalum-containing material such as tantalum or tantalum nitride (TaN), or combinations thereof. The method of forming the hard mask layer 106 includes performing a CVD process or a physical vapor deposition (PVD) process, for example.

Figure 1B:
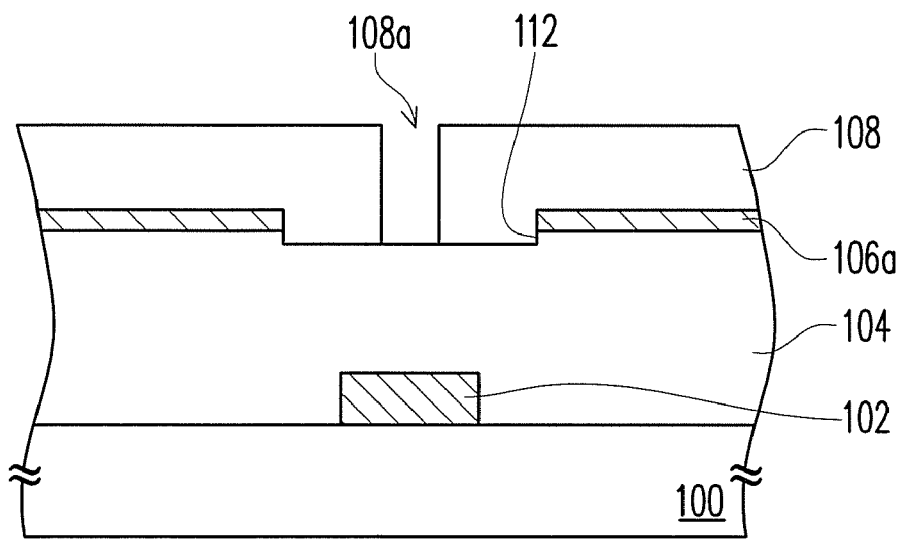

Referring to FIG. 1B, an etching process is performed, using the photoresist layer 107 (FIG. 1A) as a mask, to transfer the trench pattern 107a to a portion of the dielectric layer 104, so as to form an opening 112 in the dielectric layer 104. Thereafter, the photoresist layer 107 is removed. Afterwards, a photoresist layer 108 having a via opening pattern 108a is formed on the substrate 100. The method of removing the portion of the dielectric layer 104 includes performing a dry etching process, and the etching gases include $CHF_3$, $CF_4$, $CH_4$ and Ar, for example.

Figure 1C:
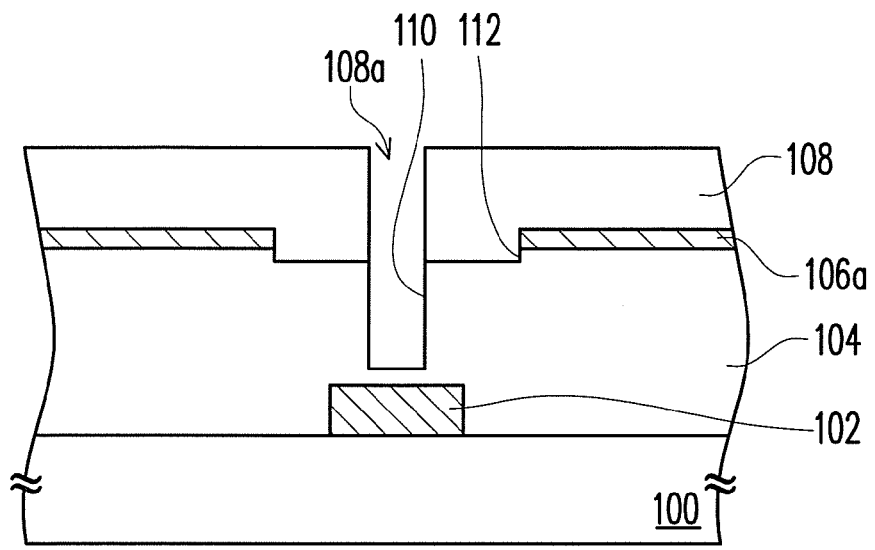

Referring to FIG. 1C, a portion of the dielectric layer 104 is removed, using the photoresist layer 108 as a mask, so as to transfer the via opening pattern 108a to the dielectric layer 104; thus, an opening 110 without exposing the metal layer 102 is formed. The method of removing the portion of the dielectric layer 104 includes performing a dry etching process, and the etching gases include $C_4H_8$, $CF_4$, $CHF_3$, $N_2$ and Ar, for example.

Figure 1D:
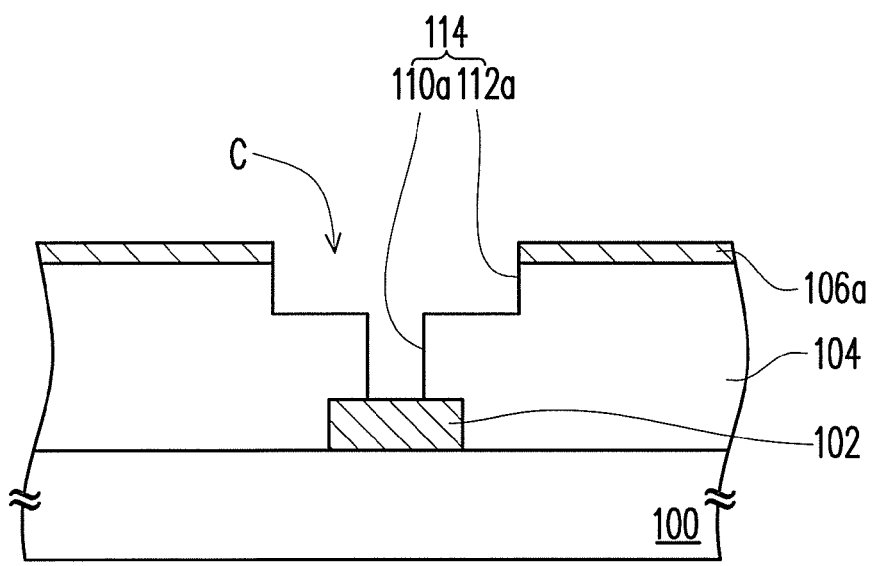

Referring to FIG. 1D, the photoresist layer 108 is removed. Afterwards, a portion of the dielectric layer 104 is removed, using the patterned hard mask layer 106a as a mask, so as to form a trench 112a and a via opening 110a which exposes the metal layer 102. In this embodiment, the trench 112a may be an opening for forming a conductive line. The via opening 110a and the trench 112a form the opening 114, so that the opening 114 is a dual damascene opening. The method of removing the portion of the dielectric layer 104 includes performing a dry etching process, and the etching gases include $CF_4$, CO and Ar, for example. During the step of removing the portion of the dielectric layer 104, residues are generated in the opening 114 and on the surface of the patterned hard mask layer 106a. The residues include organic polymers formed from the etching gases and the dielectric layer 104, and metal-containing polymers formed from the etching gases and the metal of the patterned hard mask layer 106a. The residues may cause a profile change of the opening 114, an incomplete turning on, a leakage or a short, so that the reliability of the device is reduced. Accordingly, the residues have to be removed completely.

Referring again to FIG. 1D, a cleaning solution C is used to clean the opening 114. The cleaning solution C for removing the polymers generated from the etching process includes a triazole compound with a content of 0.0275 to 3 wt %, sulfuric acid with a content of 1 to 10 wt %, hydrofluoric acid with a content of 1 to 200 ppm and water. The sulfuric acid can effectively remove the polymers formed from the metal-containing hard mask layer. During the cleaning process, the triazole compound forms a protective film on the surface of the metal layer 102 to prevent the metal layer 102 from being corroded. In details, the triazole compound reacts with the surface of the metal layer 102 to form a chelating complex to avoid the metal layer 102 from being in contact with the cleaning solution C. In this embodiment, the triazole compound such as benzotritriazolele (BTA) reacts with the surface copper of the metal layer 102 to form a copper-containing chelating complex. The chelating complex is like a protective film covering the surface of the metal layer 102, so that the metal layer 102 is protected and the Galvanic effect is avoided; in other words, the metal layer 102 is not corroded so that the reliability of the device is enhanced. Therefore, the cleaning solution C can remove the organic polymers and metal-containing polymers formed in the opening 114, and protect the metal layer 102 exposed by the opening 114 from being corroded or damaged during the etching process. After the step of using the cleaning solution C, another cleaning step is performed by introducing de-ionized (DI) water. In an embodiment, during the step of introducing DI water, $CO_2$ is introduced simultaneously to further prevent loss of the metal layer 102 exposed by the opening 114 in the cleaning process. The introduced amount of $CO_2$ is the amount which can reduce the water resistance to about 9000-1000K ohm.

Figure 1E:
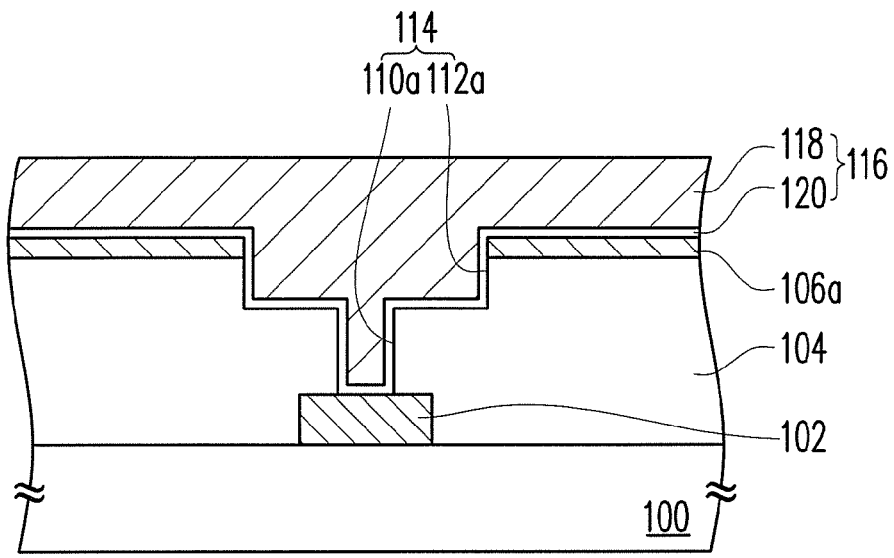

Referring to FIG. 1E, a conductive layer 116 is formed on the substrate 100 to fill the opening 114. In this embodiment, the conductive layer 116 includes a metal layer 118 and a barrier layer 120. The metal layer 118 includes copper or copper alloy. The barrier layer 120 includes TiN or TaN.

Figure 1F:
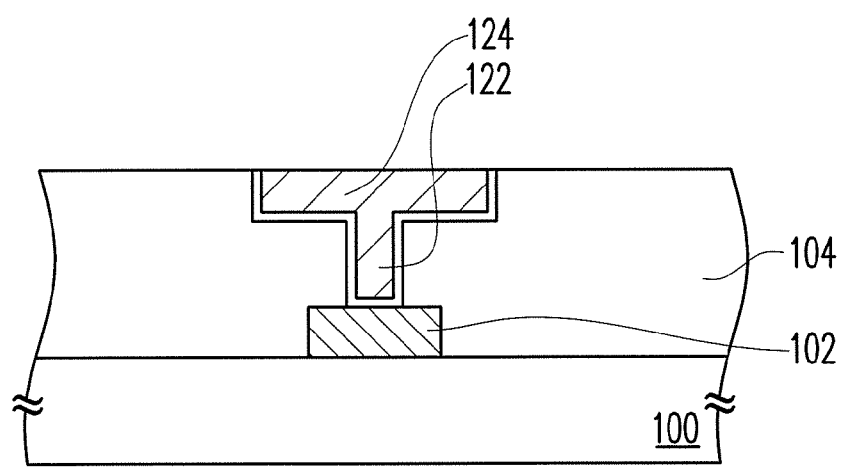

Referring to FIG. 1F, the patterned hard mask layer 106a and a portion of the conductive layer 116 are removed to form a via plug 122 and a conductive line 124. The method of removing the patterned hard mask layer 106a and the portion of the conductive layer 116 includes performing a chemical mechanical polishing (CMP) process.

This embodiment in which the dual damascene opening is formed by subsequently using the patterned photoresist layer and the patterned hard mask layer as a mask is provided for illustration purposes, and is not to be construed as limiting the present invention. It is appreciated by persons skilled in the art that the dual damascene opening can be formed by other known methods. Further, in another embodiment, the opening can be a contact hole; that is, the opening cleaned by the cleaning solution is not limited by the dual damascene opening of the present invention.

In this embodiment, after the opening is formed, the sulfuric acid in the cleaning solution can remove the polymers formed from the metal-containing hard mask layer, so as to avoid profile change of the opening, incomplete turning on between layers, a leakage or a short. The triazole compound in the cleaning solution can form a chelating complex with the surface of the metal layer exposed by the opening, so as to prevent the metal layer from being corroded or damaged; thus, the reliability of the device is enhanced.

Further, after the step of using the cleaning solution of the present invention, another cleaning step is performed by introducing DI water with $CO_2$, so as to further prevent loss of the exposed metal layer in the cleaning process.

EXAMPLES

In the following examples, a cleaning process is performed to some tested samples with different cleaning solutions. Each of the tested samples has a copper layer, a dielectric layer and a TiN hard mask layer subsequently formed thereon, and the dielectric layer has an opening exposing the copper layer.

Example 1

In example 1, a cleaning process is performed to the tested samples respectively with a cleaning solution only including HF and another cleaning solution including HF and sulfuric acid. The results show that the tested sample has a lot of residues remained thereon after cleaned by the cleaning solution only including HF, while the tested sample has no residue remained thereon after cleaned by the cleaning solution including HF and sulfuric acid. The better polymer cleaning performance with the cleaning solution including HF and sulfuric acid indicates that the sulfuric acid can effectively remove the residues formed from the TiN hard mask layer. Further, the content of the sulfuric acid in the cleaning solution is between 1 wt % and 10 wt %. The cleaning performance is not good enough when the content of the sulfuric acid in the cleaning solution is less than 1 wt %. The copper layer is corroded when the content of the sulfuric acid in the cleaning solution is more than 10 wt %.

Example 2

A cleaning process is performed to the tested samples with the cleaning solutions as shown in Table 1 including HF, sulfuric acid and different concentrations of BTA. Each of the tested samples is observed for the recess depth of the copper layer after cleaning. The recess degree is calculated by the standard of the recess depth of the copper layer of the tested sample with the cleaning solution 1 (shown as 100% in Table 1). The concentration of the sulfuric acid in the cleaning solutions 1 to 4 is 5 wt %. The concentration of the HF in the cleaning solution is 20 ppm.

TABLE 1

| Cleaning solution | BTA concentration (wt %) | Recess depth (nm) | Recess degree (%) |
|---|---|---|---|
| 1 | 0% | 43.7 | 100 |
| 2 | 0.00275% | 17.5 | 40.05 |
| 3 | 0.0055% | 16.6 | 37.99 |
| 4 | 0.0275% | 12.4 | 28.36 |

As shown in Table 1, using the cleaning solutions 2 to 4 including BTA to clean the tested samples can significantly reduce the recess degree of the copper layer etched by the cleaning solution. Thus, the BTA in the cleaning solution can prevent the copper layer exposed by the opening from being etched by the cleaning solution. Further, the BTA concentration is related to the recess degree of the copper layer of the tested sample.

Example 3

In example 3, a cleaning process is performed to the tested samples with the cleaning solutions as shown in Table 2 including HF, sulfuric acid and different concentrations of BTA. Each of the tested samples is measured for the resistance of the copper layer after cleaning, and the degree of corrosion is compared according to the resistance of the copper layer. In other words, the higher resistance of the copper layer, the higher degree of corrosion of the copper layer etched by the cleaning solution. The concentration of the sulfuric acid in the cleaning solutions 1 to 4 is 5 wt %. The concentration of the HF in the cleaning solution is 20 ppm.

TABLE 2

| Cleaning solution | Volume ratio of cleaning solution to BTA | Resistance distribution of copper layer (OHM) | Average resistance of copper layer (OHM) |
|---|---|---|---|
| 1 | No BTA | 8~13.5 | 9.98 |
| 2 | 100:1 | 4~6 | 5.42 |
| 3 | 100:2 | 4~6 | 5.27 |
| 4 | 100:10 | 4~6 | 5.15 |

As shown in Table 2, using the cleaning solutions 2 to 4 including BTA to clean the tested samples can effectively reduce the degree of corrosion of the copper layer etched by the cleaning solution. Further, compared to the cleaning solution 1 without BTA, the cleaning solutions 2 to 4 including BTA can significantly reduce the resistance distribution. That is, the BTA in the cleaning solution is capable of preventing the copper layer exposed by the opening from being corroded by the cleaning solution.

In summary, the semiconductor process and the cleaning solution of the present invention can effectively remove the residues generated in the opening, especially the polymers formed from the metal-containing hard mask layer, so that the profile of the opening can be kept. Further, the triazole compound in the cleaning solution can form a chelating complex with the surface of the metal layer exposed by the opening, so as to prevent the metal layer from being in contact with the cleaning solution and enhance the conductivity characteristics of the device. Thus, the semiconductor process and the cleaning solution of the present invention can reduce the possibility of having an incomplete turning on, a leakage or a short, so that that yield of the product is increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor process, comprising:
   forming a metal layer, a dielectric layer and a patterned hard mask layer sequentially on a substrate;
   removing a portion of the dielectric layer to form an opening exposing the metal layer; and
   using a cleaning solution to clean the opening, the cleaning solution comprising:
   a triazole compound with a content of 0.00275 to 3 wt %;
   sulfuric acid with a content of 1 to 10 wt %;
   hydrofluoric acid with a content of 1 to 200 ppm; and
   water.

2. The process of claim 1, wherein the triazole compound comprises benzotriazole.

3. The process of claim 1, wherein the metal layer comprises a first metal.

4. The process of claim 3, the first metal comprises copper.

5. The process of claim 4, wherein the metal layer comprises copper or copper alloy.

6. The process of claim 3, wherein the patterned hard mask layer comprises a second metal, and the second metal is different from the first metal.

7. The process of claim 6, wherein the second metal comprises titanium or tantalum.

8. The process of claim 7, wherein the patterned hard mask layer comprises titanium, titanium nitride, tantalum, tantalum nitride or combinations thereof.

9. The process of claim 1, wherein the opening comprises a dual damascene opening.

10. The process of claim 1, wherein the opening comprises a via opening.

11. The process of claim 1, wherein the dielectric layer comprises an inorganic material or an organic material.

12. The process of claim 1, further comprising performing another cleaning step by introducing de-ionized water with $CO_2$ after the step of using the cleaning solution to clean the opening.

13. The process of claim 1, further comprising forming a conductive layer on the substrate to fill the opening exposing the metal layer.

14. The process of claim 13, wherein the conductive layer includes a barrier layer and a metal layer on the barrier layer.

15. The process of claim 14, further comprising removing the patterned hard mask layer and a portion of the conductive layer on the substrate to form a via plug and a conductive line.

* * * * *